United States Patent [19]

Boys et al.

[11] Patent Number: 4,500,409
[45] Date of Patent: Feb. 19, 1985

[54] MAGNETRON SPUTTER COATING SOURCE FOR BOTH MAGNETIC AND NON MAGNETIC TARGET MATERIALS

[75] Inventors: Donald R. Boys, Cupertino; Walter E. Graves, San Jose, both of Calif.

[73] Assignee: Varian Associates, Inc., Palo Alto, Calif.

[21] Appl. No.: 564,777

[22] Filed: Dec. 27, 1983

Related U.S. Application Data

[63] Continuation of Ser. No. 515,093, Jul. 19, 1983, abandoned.

[51] Int. Cl.³ .............................................. C23C 15/00
[52] U.S. Cl. ................................ 204/298; 204/192 R; 204/192 M
[58] Field of Search ............... 204/298, 192 R, 192 M

[56] References Cited

U.S. PATENT DOCUMENTS

| | | | |
|---|---|---|---|
| 3,878,085 | 4/1975 | Corbani | 204/298 |
| 3,956,093 | 5/1976 | McLeod | 204/298 |
| 4,046,660 | 9/1977 | Frasser | 204/192 |
| 4,060,470 | 11/1977 | Clarke | 204/192 R |
| 4,124,474 | 11/1978 | Bomchil et al. | 204/192 |
| 4,132,612 | 1/1979 | Penfold | 204/298 |
| 4,155,825 | 5/1979 | Fournier | 204/298 |
| 4,162,954 | 7/1979 | Morrison, Jr. | 204/298 |
| 4,166,783 | 9/1979 | Turner | 204/192 R |
| 4,169,031 | 9/1979 | Brors | 204/192 |
| 4,180,450 | 12/1979 | Morrison, Jr. | 204/298 |
| 4,204,936 | 5/1980 | Hartsough | 204/192 R |
| 4,219,397 | 8/1980 | Clarke | 204/298 |
| 4,239,611 | 12/1980 | Morrison, Jr. | 204/298 |
| 4,265,729 | 5/1981 | Morrison, Jr. | 204/298 |
| 4,282,083 | 8/1981 | Kertesz et al. | 204/192 |
| 4,299,678 | 11/1981 | Meckel | 204/192 |
| 4,370,217 | 1/1983 | Funaki | 204/192 |
| 4,404,077 | 9/1983 | Fournier | 204/298 |
| 4,457,825 | 7/1984 | Lamont | 204/298 |

FOREIGN PATENT DOCUMENTS

2096177A 10/1982 United Kingdom .

Primary Examiner—Arthur P. Demers
Attorney, Agent, or Firm—Stanley Z. Cole; Leon F. Herbert

[57] ABSTRACT

A novel magnetron sputter coating source is disclosed in which magnetic sputter targets containing relatively large inventories of usable material may be employed. This coating source may also be used efficiently and effectively with sputter target materials having properties which range from nonmagnetic to highly ferromagnetic. Use of an electromagnetic coil with a widely adjustable energizing current, rather than permanent magnets, allows a wide range of magnetic properties to be accommodated. Electrical impedance of the glow discharge is readily controlled using the current flow through the electromagnetic coil, allowing, for example, operation at desired values of voltage and current throughout the life of the sputter target. In addition, a momentary increase in electromagnet coil current can be used to achieve ignition of the glow discharge at a desired sputter gas operating pressure which is below the sputter gas pressure at which the glow discharge can normally be readily ignited. Also, use of the electromagnetic coil permits an easy conversion of the magnetron sputter coating source to a nonmagnetic diode apparatus. The use of a Hall probe positioned adjacent and below the sputter target near the region of maximum erosion is disclosed. The Hall probe voltage, which is proportional to the magnetic field intensity at the Hall probe position, may be measured throughout sputter target life to provide an independent means of assessing the approach to end of useful life. A novel sputter target cooling means is disclosed in which a water chamber below the sputter target is divided into inlet and outlet portions by a septum. The flow of water through a narrow gap between the septum and the sputter target leads to highly effective heat transfer, which is also highly uniform along the peripheral path of intense heating of the sputter target.

73 Claims, 4 Drawing Figures

MAGNETRON SPUTTER COATING SOURCE FOR BOTH MAGNETIC AND NON MAGNETIC TARGET MATERIALS

This application is a continuation of application Ser. No. 515,093, filed 07/19/83, now abandoned.

FIELD OF THE INVENTION

This invention is in the field of vacuum coating apparatus and particularly relates to coating with both magnetic and nonmagnetic materials using magnetron sputter coating sources.

BACKGROUND OF THE INVENTION

Vacuum deposition of coatings using cathode sputtering induced by glow discharges is currently in widespread use. Sputter coating sources include cathode and anode structures, and are operated in an evacuated chamber backfilled with a sputter gas (typically argon at subatmospheric pressure). Positive ions formed in the space between anode and cathode impact a target located on the cathode surface, ejecting (by sputtering) atoms of target material from the surface and near subsurface atomic layers of the target. These sputtered atoms deposit on workpieces or substrates placed generally in line of sight of the target. Magnetron sputter coating sources employ magnetic fields crossed with electric fields in the vicinity of the target. The use of such magnetic fields can enhance glow discharge intensities and the attendant sputtering rates, extend operation to lower sputter gas pressures, confine the flow discharge to the neighborhood of the electrodes, and reduce electron bombardment of the substrates.

One type of magnetron sputter coating source in commercial use employs a nonmagnetic annular sputter target (cathode) of a generally inverted conical configuration surrounding an axially symmetric central anode. One example of such a sputter coating source may be found described in U.S. Pat. No. 4,100,055, issued July 11, 1978 to Robert M. Rainey and entitled "Target Profile for Sputtering Apparatus" and assigned to the assignee of the present invention. Magnetron sputter coating sources of the type just mentioned have been used extensively and effectively in important semiconductor wafer coating applications. In most cases, the materials being deposited are nonmagnetic, such as aluminum and its alloys, etc. In some cases, however, it has been desired to use the same sputter coating source to dispense such magnetic materials as iron, nickel, iron-nickel-alloys, etc., as well as the nonmagnetic materials for which the sputter coating source was initially designed. More recently, a need has emerged for coating magnetic disk substrates with multiple layers, at least one of which is of magnetic material. Magnetic disks are now vitally important in computer memory applications.

Simply replacing a nonmagnetic sputter target with a magnetic one of the same generally inverted conical configuration in the magnetron sputter coating source referred to above causes most of the magnetic field to be shunted through the magnetic target. This results in magnetic field intensities above the target which are too low to allow the desired magnetic enhancement of the glow discharge to take place.

In order to avoid excessive reduction in magnetic field intensities above the target, annular magnetic sputter targets of a generally L-shaped profile have been developed for use in the above-described sputter coating source. One such L-shaped magnetic sputter target is described in U.S. Pat. No. 4,060,470, issued Nov. 29, 1977 to Peter J. Clarke and entitled "Sputtering Apparatus and Method" (see FIG. 9). An essential feature of the L-shaped design is that the radial thickness of the outer annular band portion must be sufficiently thin that it is magnetically saturated in order that the magnetic field intensities above the target can be made sufficiently great that the desired magnetic enhancement of the glow discharge takes place. The higher the magnetic permeability and the saturation magnetization of the material, the thinner the annular band portion must be.

Magnetic sputter targets having an L-shaped profile contain much less material than nonmagnetic sputter targets of a generally inverted conical configuration. Moreover, the magnetic fields above the L-shaped magnetic targets lead to target erosion which is concentrated in the corner region. In relative terms, the inventory of magnetic target material usefully available for sputtering is therefore very limited.

It is also known that a magnetic material heated to or above its Curie temperature loses its ferromagnetism while so heated. Another approach to avoiding excessive reduction in magnetic field intensities above the sputter target, therefore, is to heat the target and maintain it at or above its Curie temperature. A disadvantage of this approach is that it requires means for monitoring the temperature of the target, coupled with a feedback system for achieving and maintaining the required Curie temperature. Also, the Curie temperature of some magnetic materials is so high as to be detrimental to the adjacent substrate being coated and/or to the vacuum seals for the system and/or to cause damage to the sputter coating source or target as a result of warping or excessive thermal expansion.

Most present-day magnetron sputter coating sources employ permanent magnets to provide the magnetic field required for glow discharge enhancement. As the sputter target erodes, the magnetic field intensities above the sputter target generally become stronger, leading to a lower electrical impedance of the glow discharge. This causes the sustainable voltage across the glow discharge to fall, bringing with it a decrease in sputtering yield. Maintaining a fixed sputtering rate, and hence a fixed coating rate, at a desired sputter gas pressure requires both higher current and a higher power. The glow discharge power supply must therefore be capable of providing extended ranges of voltage, current, and power, which adversely affects both power supply and power consumption costs.

Additional factors affect the electrical impedance of glow discharges. Sputter gas pressure is one. Others include thermal effects (expansion, contraction, and Curie-temperature-related) in sputter targets and magnetic circuits. The permanent magnet means used in most present-day magnetron sputter coating sources do not provide compensation of glow discharge impedance changes arising from such factors.

It is a well-known characteristic of glow discharges that the conditions for ignition (discharge initiation) and steady state operation are different. In some cases it is desirable to operate at a sputter gas pressure so low that ignition cannot occur with the magnetic fields in the sputter source (as provided by the usual permanent magnets) and the open-circuit voltage of the glow discharge power supply. One technique that can be used is to raise the sputter gas pressure sufficiently to allow ignition to occur, and then to reduce the sputter gas pressure to the desired operating level. Disadvantages of this approach include the relatively long time constants associated with the required pressure changes, plus the costs and complexity associated with controlling sufficiently quickly (that is, in times short in comparison with a coating cycle) the sputter gas pressure, which is normally controlled by flow rate and pumping speed.

An ever-present problem in magnetron sputter coating sources is sputter target cooling. In normal operation, much of the glow discharge power is dissipated in the target. In the source described in above-mentioned U.S. Pat. No. 4,100,055, a cooling jacket surrounds the outer circumference of the target. Under conditions of normal operation, the target expands into tight contact with the cooling jacket, whereupon heat flows from the sputter target into the cooling jacket. This arrangement works well for target materials with adequate thermal conductivities, such as various aluminum alloys and mixtures. For target materials having relatively low thermal conductivities, as do many of the magnetic materials, cooling by this method may be insufficient.

Another problem in magnetron sputter coating sources is that of predicting or determining the end of useful life. If an indirectly cooled sputter target is sputtered "through", sputtering of the target support member is likely to unacceptably contaminate the substrate being coated. If a directly cooled sputter target (that is, one in which the non-sputtered side is in contact with cooling water) is sputtered through, the entire associated vacuum chamber goes "up to water" (a situation to be assiduously avoided).

One method of dealing with the end-of-useful-life problem is to determine empirically how long (for example, how many kilowatt-hours of operation) a sputter target of a particular configuration and material is good for, to maintain an accurate log of accumulated kilowatt-hours, and then to simply replace targets in accordance with a rigid schedule. While this approach may be entirely appropriate for routine production using a mature process, alternative approaches may be more desirable in the early stages of process development. In particular, independent means of assessing the erosion, or life, status of a sputter target during process development would be highly desirable. In addition, such a means would provide a useful diagnostic tool even for routine production.

Yet another problem in the use of most magnetron sputter coating sources is that the distribution pattern of sputtered material arriving at the substrate being coated changes as the sputter target erodes during normal operation. With target erosion, the glow discharge moves into a region of higher magnetic field intensities. This causes the discharge to become increasingly concentrated, thereby producing an increasingly narrow groove as the erosion proceeds. This leads to changes in the distribution pattern of sputtered material (a "beaming" effect), and to a reduced inventory of usable sputter target material, with attendant reduced target life.

Accordingly, it is an object of the invention to provide a magnetron sputter coating source which can utilize efficiently a large inventory of magnetic sputter target material.

It is a further object of the invention to provide a magnetron sputter coating source which can utilize efficiently a large inventory of sputter target material, independent of magnetic permeability and saturation magnetization of the target material.

It is also an object of the invention to provide a magnetron sputter coating source in which the sputter target configuration can be independent of magnetic permeability and saturation magnetization of the target material.

It is another object of the invention to provide a magnetron sputter coating source in which a magnetic sputter target may be usefully operated at a temperature below the Curie temperature of the magnetic target material.

It is a further object of the invention to provide a magnetron sputter coating source in which a means is provided for controlling the electrical impedance of the glow discharge in the face of changes which may occur due to sputter target erosion.

It is yet another object of the invention to provide a magnetron sputter coating source in which a means is provided for controlling the electrical impedance of the glow discharge in the face of sputter target temperature changes.

It is a still further object of the invention to provide a magnetron sputter coating source in which a means is provided for controlling the electrical impedance of the glow discharge in the face of magnetic circuit changes.

It is another object of the invention to provide a magnetron sputter coating source in which a means is provided for controlling the electrical impedance of the glow discharge in the face of sputter gas pressure changes.

It is an additional object of the invention to provide a magnetron sputter coating source in which a means is provided for effecting glow discharge ignition at a desired steady-state sputter gas operating pressure.

Another object of the invention is to provide a magnetron sputter coating source in which an improved sputter target cooling means is provided.

An additional object of the invention is to provide a magnetron sputter coating source in which an independent means of assessing sputter target erosion is provided.

A further object of the invention is to provide a magnetron sputter coating source being a means for controlling the distribution pattern of sputtered material arriving at the substrate being coated, with such control being provided throughout the useful life of the sputter target.

A still further object of the invention is to provide a magnetron sputter coating source in which a means is provided for increasing the useful life the sputter target.

Additional objects and features will become apparent from the ensuing description of the invention.

SUMMARY OF THE INVENTION

The magnetron sputter coating source of the present invention differs from most prior art sources in that the magnetic field is provided by current flowing through an electromagnet coil rather than by a permanent magnet. In consequence, the magnetic field in the neighborhood of the sputter target may be conveniently and rapidly varied over a wide range of values, including zero. In the embodiments described, the electromagnet coil surrounds an inner cylinder. A base plate connects the inner cylinder with an outer cylinder to form a magnetic yoke. Inner and outer polepieces extend radially toward each other from the inner and outer cylinders. A radial gap between the polepieces is provided, and the sputter target is positioned atop this gap. The yoke and the polepieces are made of ferromagnetic materials having high magnetic permeabilities and high saturation magnetizations, such as soft iron or a magnetic stainless steel. The base plate and cylinders have sufficiently large cross-sectional areas transverse to the direction of the internal magnetic flux lines that a very low reluctance (low magnetic resistance) path to the polepieces is provided at the maximum electromagnet coil current (to produce maximum magnetomotive force) required during operation.

When a sputter target of magnetic material is positioned atop the polepiece gap, it acts as a magnetic shunt at sufficiently low coil currents, whereby the magnetic field intensities adjacent the target are negligibly small. Upon increasing the coil current sufficiently, the onset of magnetic saturation of a portion of the target will occur. For a ring-shaped magnetic target of uniform thickness, this initial saturation will take place at a radius slightly greater than that of the inner polepiece, and fringing magnetic field lines will be established above and below the target near this radius. As the coil current is increased further, the magnetically saturated region will increase in radial extent, forming a high reluctance magnetic gap across which fringing magnetic field lines of increased intensity will be established. Unsaturated portions of the target will extend axially above the polepieces, and also radially inward and outward of the above-mentioned magnetic gap, thereby forming axial and radial extensions of the polepieces. At a particular required value of coil current, the configuration and intensities of magnetic fields above the target will permit the desired enhancement of the glow discharge to be achieved. This required value will increase with the magnetic permeability and the saturation magnetization of the target material, and also with target thickness.

In the disclosed embodiments of the invention, magnetic field intensities large enough to permit the desired enhancement of the glow discharge are achieved with rewardingly small amounts of electromagnet coil power being required. For example, less than 50 watts of electromagnet coil power are needed to operate a magnetron sputter coating source in which the glow discharge power is in the 1 to 10 kilowatt range. This is true even for relatively thick magnetic sputter targets containing a desirably large inventory of usable material.

When a nonmagnetic sputter target is used, the fringing magnetic fields above and below the target will be determined by the polepieces configurations and the electromagnet coil current. In general, a smaller coil current will be required with a nonmagnetic target than with a magnetic one.

A polepiece configuration and spacing which is best for a sputter target material of high magnetic permeability and high saturation magnetization may work well for nonmagnetic targets. But better performance in terms of sputter target erosion patterns and material utilization may be obtained with a somewhat different polepiece configuration and separation. One feature of the invention is to provide readily replaceable and interchangeable polepieces so that a magnetron sputter coating source of a particular basic design can be used in optimum or near-optimum fashion with sputter targets having a wide range of magnetic characteristics.

Another consequence of having readily replaceable and interchangeable polepieces is that the radial position of the sputter target erosion pattern may be shifted over a significant range in a particular magnetron sputter coating source, which may be important to the achievement of a desired distribution and uniform pattern in coating thickness on a substrate.

Many features and characteristics of glow discharges depend upon magnetic field configurations and intensities above the sputter surface of the target, including discharge impedance, sputter gas pressure ranges for operation and for ignition, the configuration and position of the glow discharge, and the position and shape of the erosion pattern. An electromagnet coil means for providing the magnetic fields adjacent the sputter target allows these fields to be controlled and changed at will. Such control is accomplished with particular ease because of the relatively low electromagnet coil powers required in the disclosed embodiments of the present invention.

Glow discharge impedance control is of particular importance because it can allow, for example, operation at a constant discharge voltage over a wide range of discharge currents. With sputter target erosion during normal operation, the glow discharge generally moves into a region of higher magnetic field intensities, which lowers the discharge impedance and voltage for a fixed sputter gas pressure. The lower discharge voltage leads to a reduced sputter yield from the target. To maintain a fixed coating deposition rate, it is necessary to increase both the current and the power in the discharge. Reducing the electromagnet coil current allows the magnetic field intensities to be reduced, bringing a return to the original discharge impedance and voltage. Electrical control of the magnetic field can, for example, maintain discharge voltage and current constant over the life of the sputter target. This has important implications to the design and construction of the glow discharge power supplies because the power supplies no longer have to provide a wide range of output voltage.

When a sputter target erodes and the glow discharge moves into a region of higher magnetic field intensities, the discharge tends to become increasingly concentrated, thereby producing a relatively narrow groove as erosion proceeds. This leads changes in the distribution pattern of sputtered material, and to a reduced inventory of usable sputter target material (therefore reduced life). This effect is also alleviated by reducing magnetic field intensities through electromagnet coil current control.

The radial position and the widths of the sputter target erosion pattern, and hence the distribution pattern of sputtered material, are influenced by the magnetic field intensities above the sputter surface. Electrical control of these magnetic field intensities therefore allows a measure of control to be exercised over this distribution pattern.

It is known that the magnetic fields above the sputter target determine the ranges of sputter gas pressure both for ignition and for operation. In general for a given magnetic field distribution, a glow discharge will operate stably at pressures somewhat below the lowest pressure at which the discharge can be initiated. In some applications, operation at relatively low sputter gas pressures may be desirable because of reduced gas scattering of sputtered material en route from target to substrate. One method of obtaining ignition in such cases is to temporarily increase the sputter gas pressure, and then reduce it after the discharge has been initiated. With electrical control of magnetic fields available, a simpler and more convenient method of achieving ignition is to increase the electromagnet coil current momentarily while maintaining sputter gas pressure at the desired operating level.

In some applications it may be desired to convert, either temporarily or for an extended period, an existing magnetron sputter coating source to a nonmagnetic diode sputtering apparatus or a sputter-etch cleaning station. Such a conversion is readily accomplished with the disclosed embodiment of the present invention simply by reducing the electromagnet coil current to zero (after reversal to achieve demagnetization, if necessary).

Another feature of the present invention is the inclusion and use of a magnetic field sensor in the neighborhood of the sputter target. In the disclosed embodiments of the invention, the magnetic field sensor is a Hall probe located adjacent the water-cooled side of the sputter target near the radial position of maximum erosion. With magnetic targets, the magnetic field sensed by the Hall probe changes rapidly with target erosion. The end of useful life for sputter targets can be established empirically in terms of, for example, kilowatt-hours. An independent check on the status of magnetic sputter target erosion, and hence of the corresponding approach to the end of useful life, can usefully and conveniently be made using the above-mentioned magnetic field sensor. In short, the Hall probe magnetic field sensor is a valuable diagnostic tool.

When a nonmagnetic sputter target is employed, it is useful, as discussed previously, to adjust the magnetic fields electrically to allow, for example, constant voltage operation of the discharge. The Hall probe can be beneficially used to monitor the local magnetic field, which can be independently correlated with sputter target erosion and the approach to the end of useful life.

Disclosed in one of the embodiments of the invention is a novel sputter target cooling means. The bottom side of the target is in contact with a water chamber. A septum divides the chamber into inlet and outlet portions. In flowing from inlet to outlet, the water is constrained to flow through a narrow gap between the top of the septum and the bottom of the target. The septum is located directly under the region of maximum target erosion. The sputter target may thus be cooled efficiently and uniformly adjacent the region of maximum power dissipation.

In the case of a magnetic target in particular, the Hall probe can provide valuable independent information regarding the approach to the end of useful life, thereby helping to avoid a catastrophic leak from the water chamber through the sputter target.

DETAILED DESCRIPTION

Figure 1:
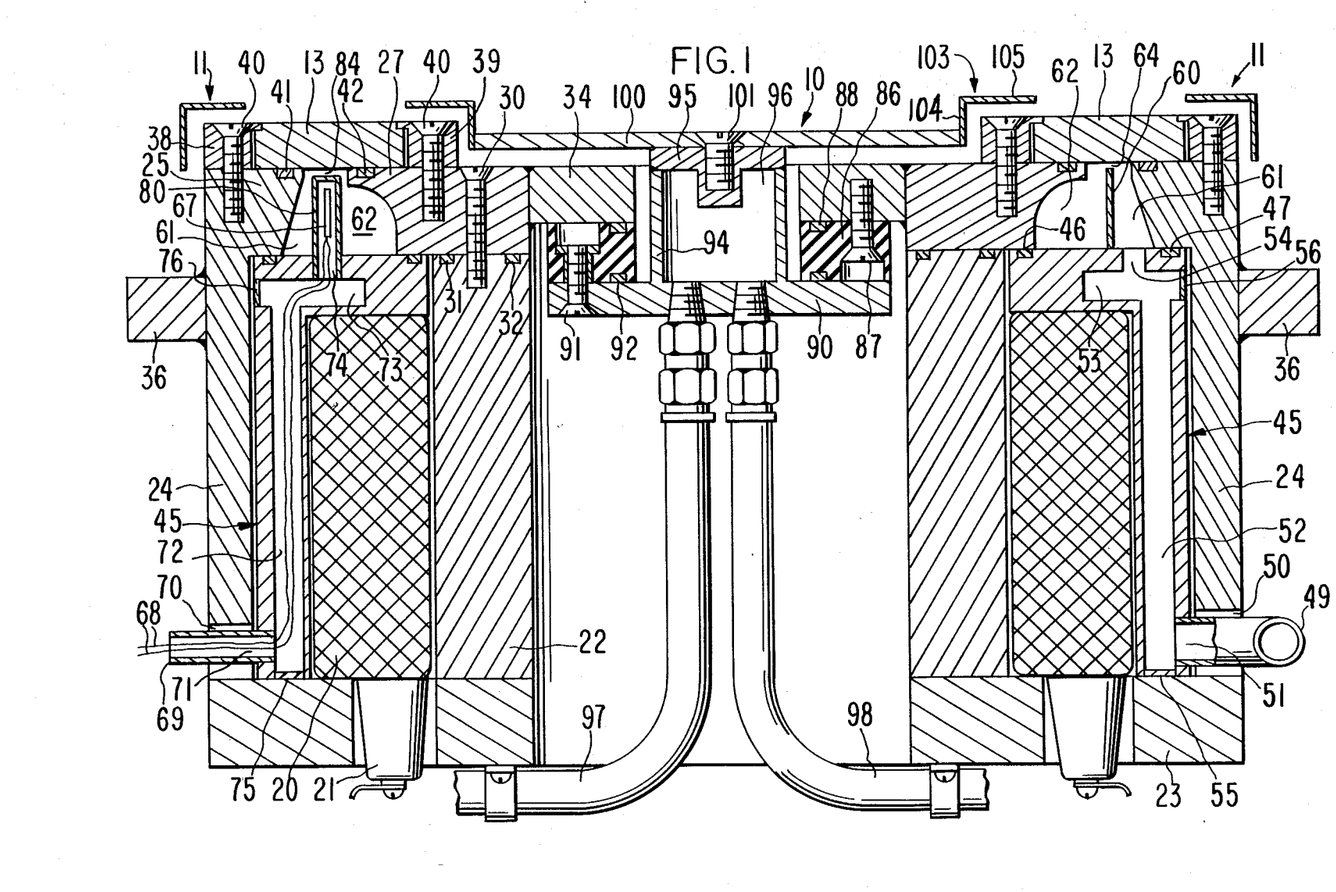
FIG. 1 is a side view mostly in cross-section of a preferred embodiment of a circular magnetron sputter coating surface of the present invention.

The sputter coating source of FIG. 1 includes a central anode assembly 10, an outer anode 11, and a sputter target 13, which serves also as a cathode. Apart from sputter target 13, the magnetic circuit comprises an electromagnet coil 20 with electrical feedthroughs and connectors 21, a hollow central cylinder 22, a base plate 23, a hollow outer cylinder 24, an outer polepiece 25 (shown integral with cylinder 24), and an inner polepiece 27. All parts 22–27 are of high permeability, high saturation ferromagnetic materials, such as soft iron and magnetic stainless steel, and are relatively massive to provide a low resistance magnetic path, with the largest magnetic resistance being provided by sputter target 13 across the gap between polepieces 25 and 27.

Base plate 23 is attached by a plurality of screws (not shown) to cylinders 22 and 24 to form a magnetic yoke. Polepiece 27 is attached to cylinder 22 by means of a plurality of screws 30 (2 shown), and a vacuum seal is provided between parts 27 and 22 by O-rings 31 and 32. An interior flange 34 is welded or brazed to polepiece 27 for supporting central anode assembly 10. An exterior flange 36 is welded or brazed to cylinder 24 to provide insulative connection with outer anode 11, in a manner similar to that shown for the embodiment of FIG. 2. Sputter target 13 is affixed to polepiece 25 by an outer clamp 38, and to polepiece 27 by an inner clamp 39. A plurality of screws 40 (4 shown) attach clamps 38 and 39 to polepieces 25 and 27, and O-rings 41 and 42 provide the vacuum seal between sputter target 13 and polepieces 25 and 27.

Water cooling of sputter target 13 is accomplished with the aid of a manifold 45. Manifold 45 is held in firm contact with polepieces 25 and 27 by base plate 23, and a vacuum seal between manifold 45 and polepieces 25 and 27 is provided with the aid of O-rings 46 and 47. A water inlet conduit 49 passes through a clearance bore 50 through cylinder 24 and is sealed into a first horizontal bore 51 in manifold 45. A first vertical bore 52, a second horizontal bore 53, and a second vertical bore 54 complete the water flow path through manifold 45. Bore plugs 55 and 56 are sealed as shown to confine the water flow path. A cylindrical septum 60 is attached to the top surface of manifold 45 to form an inlet annulus 61 and an outlet annulus 62. In a manner similar to that shown for the inlet portion, one or more outlet conduits (not shown) are connected via a series of horizontal and vertical bores to outlet annulus 62. A spacing 64 between the top edge of septum 60 and the bottom surface of sputter target 13 is made uniformly small to ensure an adequate but high impedance flow of water under the bottom surface of sputter target 13 to provide uniform cooling around the circumference thereof.

A Hall probe 67 for measuring magnetic field strengths is located below sputter target 13 and between inlet and outlet annuluses 61 and 62. Four electrical leads 68 (two shown) are connected through a conduit 69 to Hall probe 67. Conduit 69 passes through horizontal clearance bore 70 through cylinder 24, and is sealed into a first horizontal bore 71 in manifold 45. A first vertical bore 72, a second horizontal bore 73, and a second vertical bore 74 provide a path for electrical leads 68 from Hall probe 67 through conduit 69. Bore plugs 75 and 76 serve to seal the passageway. A length of capped tubing 80 surrounds Hall probe 67 and is brazed or welded into second vertical bore 74. As illustrated in FIG. 1, the radial position of Hall probe 67 is essentially the same as that of septum 60. The presence of surrounding capped tubing 80 therefore introduces an interruption of cylindrical septum 60 between inlet annulus 61 and outlet annulus 62. A spacing 84 between the top surface of capped tubing 80 and the bottom surface of sputter target 13 is chosen to provide substantially the same high impedance to water flow as that provided by spacing 64 for septum 60.

Central anode assembly 10 is insulatively mounted on interior flange 34. An insulating ring 86 is secured to flange 34 by a plurality of screws 87 (one shown), and a vacuum seal between ring 86 and flange 34 is provided by an O-ring 88. A base member 90 is fastened to insulating ring 86 with a plurality of screws 91 (one shown), with a vacuum seal being provided with the aid of an O-ring 92. Base member 90 includes a hollow cylindrical section 94 to which is attached a top cap 95, whereby water cooling chamber 96 is formed. An inlet water line 97 and an outlet water line 98 connect to chamber 96, whereby water cooling of central anode assembly 10 may be accomplished. A central disk 100 is attached to top cap 95 by means of a central screw 101. Attached to central disk 100 is a right angle member 103 consisting of a cylindrical portion 104 and a flat ring portion 105.

A support means for outer anode 11 is not shown in FIG. 1. Outer anode 11 may, however, be supported in the manner shown below for the anode in the embodiment of FIG. 2.

Figure 2:
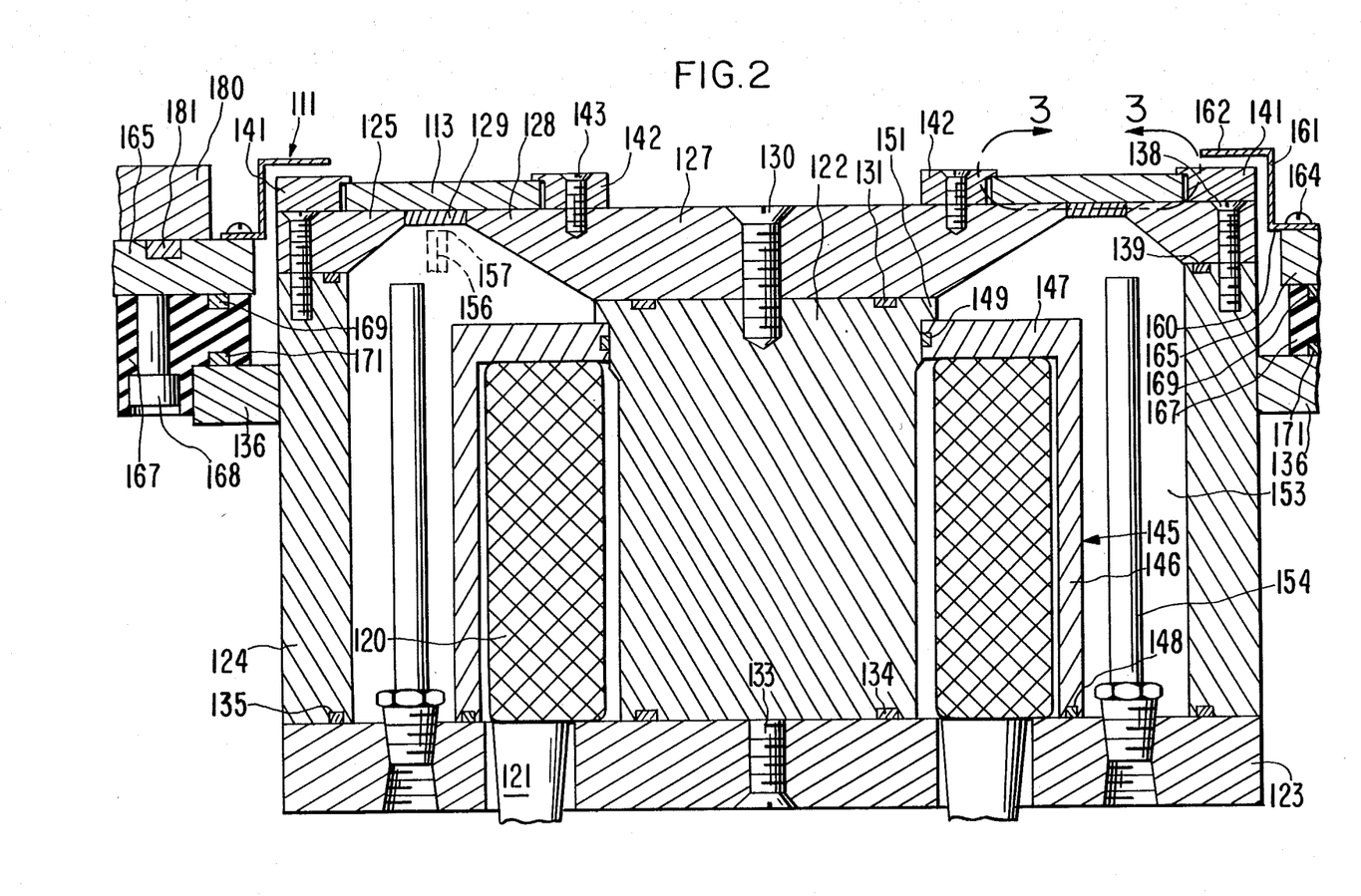
FIG. 2 is a side view mostly in cross-section of an alternate embodiment of a circular magnetron sputter coating source of the present invention.

The magnetron sputter coating source of FIG. 2 includes an anode 111 and a sputter target (cathode) 113. Apart from target 113, the magnetic circuit comprises an electromagnet coil 120, with electrical fittings and connections 121, a central cylinder 122, a base plate 123, a hollow outer cylinder 124, an outer polepiece 125, a top plate 127, and an integral inner polepiece 128. Taken together, parts 122, 123, 124, and 127 form a magnetic yoke between polepieces 125 and 128. Parts 122–128 are made of high permeability, high saturation ferromagnetic materials of comparatively large cross-section to provide a low impedance magnetic path through polepieces 125 and 128. A nonmagnetic ring 129 is brazed or welded to polepieces 125 and 128, forming a vacuum tight joint thereto. A screw 130 secures top plate 127 to central cylinder 122, and an O-ring 131 provides the vacuum seal between plate 127 and cylinder 122. Similarly at the bottom a screw 133 secures base plate 123 to cylinder 122, and an O-ring 134 provides the vacuum joint between base 123 and cylinder 122. A plurality of screws (not shown) secures base plate 123 to outer cylinder 124, and an O-ring 135 provides a vacuum seal between plate 123 and cylinder 124. An exterior flange 136 is welded or brazed to the outside of outer cylinder 124 to allow insulative attachment to a vacuum chamber or to a processing station, and also to anode 111.

A plurality of screws 138 (two shown) secure polepiece 125 to outer cylinder 124, and an O-ring 139 provides the vacuum seal between polepiece 125 and cylinder 124. Sputter target 113 is secured to polepieces 125 and 128 by an outer clamp 141 and an inner clamp 142 which are in turn secured by a plurality of screws 143 (two shown for clamp 142, none shown for clamp 141).

Coil 120 partially surrounds central cylinder 122. A coil jacket 145 partially surrounds coil 120. Jacket 145 includes a cylindrical portion 146 and a flat ring portion 147. An O-ring 148 provides a water-tight joint between base 123 and cylindrical portion 146, and an O-ring 149 provides a water-tight jacket between inner cylinder 122 and flat ring portion 147. A step 151 in inner cylinder 122 engages the top surface of flat ring portion 147. A water cooling chamber 153 is formed, bounded by the inner surface of cylinder 124, top surface of base 123, outer surface of coil jacket 145, outer portion of step 151, portions of polepieces 125 and 128, and the bottom surface of nonmagnetic ring 129. Water is introduced into chamber 153 through a plurality of squirt tubes 154 (two shown), which are introduced through penetrations in base plate 123. These squirt tubes direct a plurality of water jets onto the bottom surface of nonmagnetic ring 129 to provide cooling of sputter target 113. Outlet for return water flow is provided by means not shown.

The positioning of Hall probe 67 adjacent sputter cathode 13 has been described previously in connection with FIG. 1. A Hall probe 156 inside a capped tube 157 is shown schematically inside chamber 153 positioned closely adjacent nonmagnetic ring 129. Although not explicitly shown in FIG. 2, a squirt tube 154, for example, could be readily modified to provide a straightforward means of introducing and positioning Hall probe 156.

Anode 111 is formed of an outer disk portion 160, a cylindrical portion 161, and an inner disk portion 162. A plurality of screws 164 (two shown) secure anode 111 to a mounting plate 165. An insulating ring 167 is secured to mounting plate 165 by means of a plurality of screws 168 (one shown), and an O-ring 169 provides a vacuum seal between insulating plate 167 and mounting plate 165. Exterior flange 136 is engaged by means not shown and held in contact with insulating ring 167, and an O-ring 171 provides the vacuum seal between flange 136 and ring 167. Mounting plate 165 is engaged by means not shown with a flange 180. Flange 180 may, for example, connect to a vacuum system or to a processing station. The vacuum joint between mounting plate 165 and flange 180 is provided by an O-ring 181.

Figure 3:
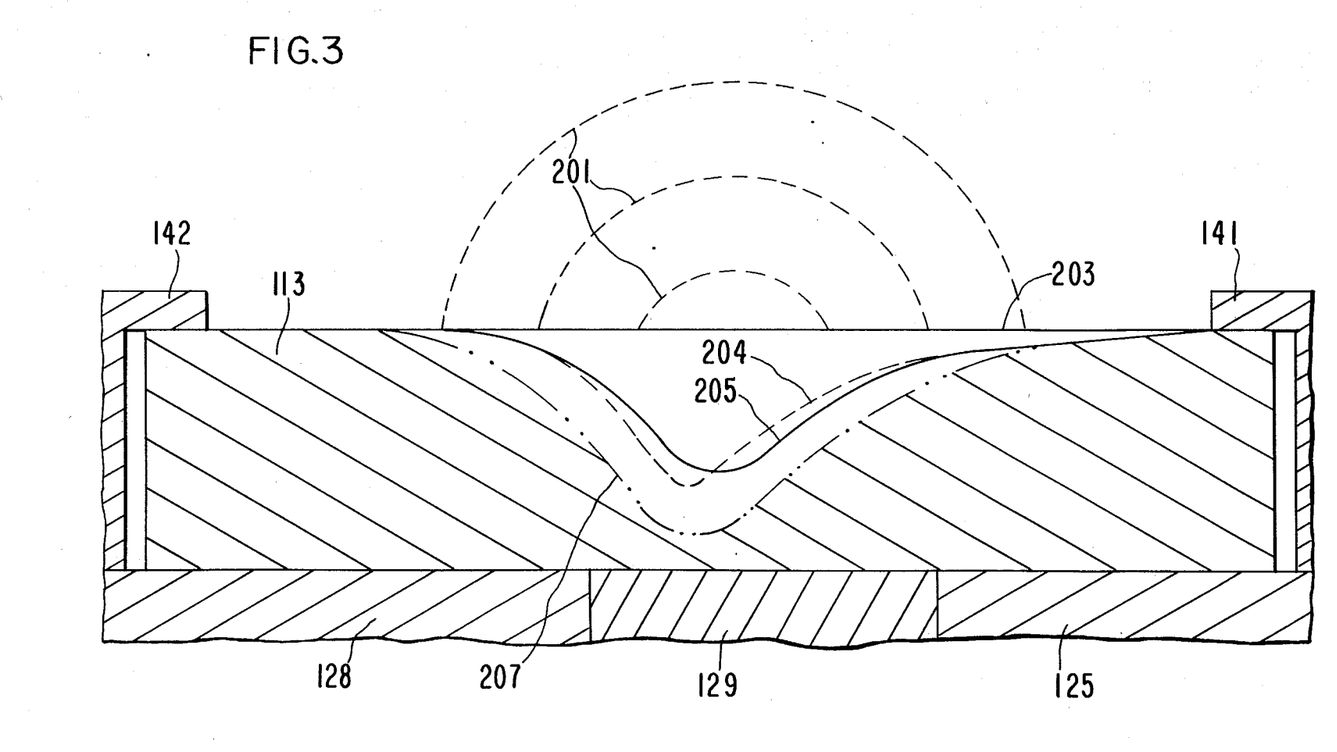
FIG. 3 is a fragmentary view showing a portion of the sputter target of FIG. 2 at various stages of erosion.

FIG. 3 shows a fragmentary section of sputter target 113 of FIG. 2. In FIG. 3, sputter target 113 has an inner radius of 1.75 inches, an outer radius of 3.56 inches, and a thickness or vertical height of 0.375 inches.

In FIG. 3, representative magnetic field lines 201 are shown qualitatively above the target. Among other things, the shape of magnetic field lines 201 depends strongly on the level of magnetic saturation of the magnetic material of target 113. Sputter target 113 has an uneroded surface profile 203 when new. After operating a sputter target 113 made of 410 stainless steel for 52.6 kilowatt-hours at constant current to electromagnet coil 120, profile 204 was obtained. After operating a sputter target 113 made of Permalloy for 57.5 kilowatt-hours, with current to electromagnet coil 120 adjusted to maintain constant magnetic field as measured by Hall probe 156, profile 205 was obtained. An end-of-useful-life profile 207 is estimated for the above Permalloy target. The useful life for the target is estimated to be in excess of 100 kilowatt-hours.

Figure 4:
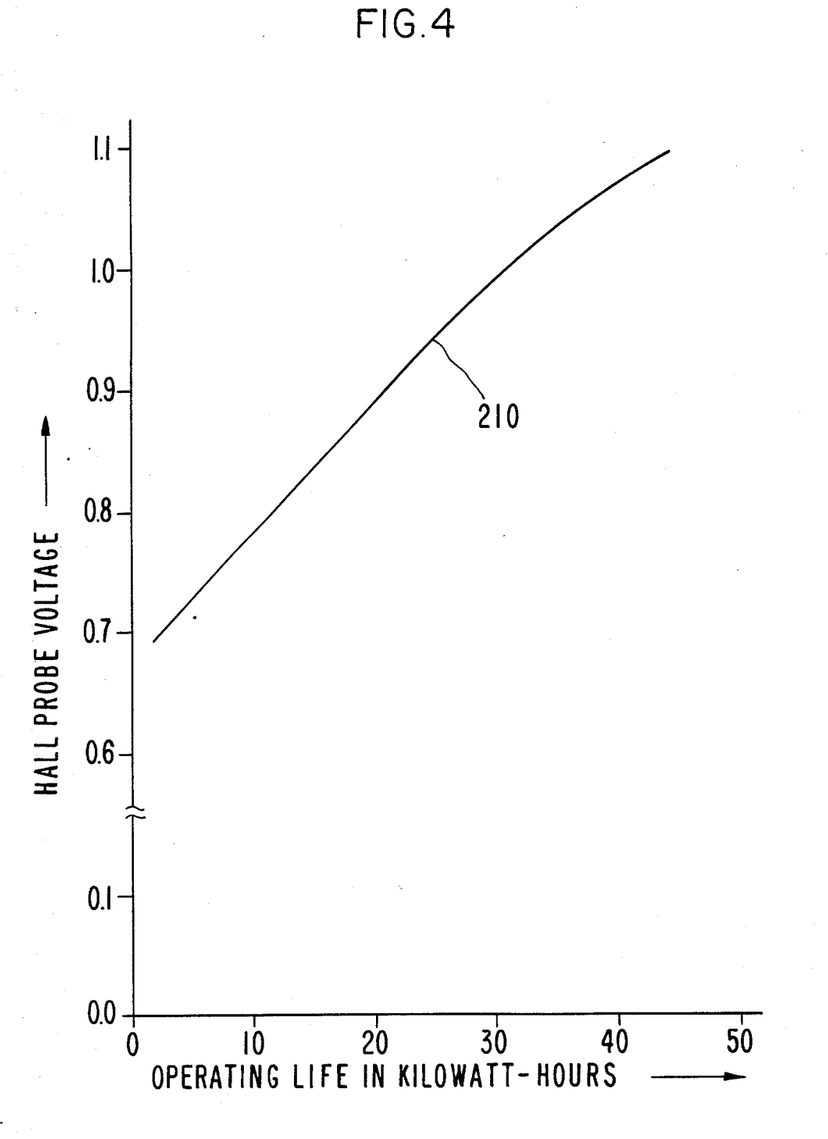
FIG. 4 shows a curve of Hall probe voltage as a function of operating life for a Permalloy sputter target used in the magnetron sputter coating source of FIG. 2.

FIG. 4 shows a curve 210 of Hall probe 156 output voltage as a function of operating life (measured in kilowatt-hours) of a Permalloy sputter target 113. This is the same target that gave rise to profile 205 in FIG. 3. As previously noted, profile 205 was obtained after 57.5 kilowatt-hours of operation, with current to coil 120 adjusted to maintain constant magnetic field as measured by Hall probe 156.

Curve 210 was generated by periodically returning the coil 120 current to a fixed value (4.0 amps, with sputter source operation interrupted) and measuring Hall probe 156 output voltage. This voltage is proportional to the magnetic field at the Hall probe location. It may be seen from curve 210 that this magnetic field rose by over 50% during the first 40 hours of operation.

To operate the magnetron sputter coating source of FIG. 1, it is first installed, for example, on a mating flange of an evacuable chamber. Central anode assembly 10 and outer anode 11 may be tied together electrically and connected to the positive voltage terminal of a glow discharge power supply. The positive terminal of the supply may optionally be connected to ground. Alternatively, central anode assembly 10 may be separately connected to permit biasing with respect to outer anode 11. The magnetic circuit includes a magnetic yoke (consisting of base plate 23 and cylinders 22 and 24) associated polepieces 25 and 27, plus sputter target 13. These parts are electrically joined together, and are electrically insulated from anodes 10 and 11. Because of its position relative to anodes 10 and 11 and to polepieces 25 and 27, sputter target 13 serves as the cathode of the sputter source. During operation, the magnetic circuit and the cathode are connected to the negative terminal of the glow discharge power supply. Electromagnet coil 20 is energized through electrical connectors 21 by a variable-voltage magnet power supply. The magnetic field above the sputter surface of target 13 depends both upon the current in electromagnet coil 20 and on the magnetic permeability and saturation magnetization characteristics of the material of which sputter target 13 is made.

The current required to sensitize Hall probe 67 is provided by a Hall probe control unit connected to electrical leads 68. The resulting Hall voltage is proportional to the magnetic field at the location of Hall probe 67, and is measured by the Hall probe control unit. Cooling water is supplied to water inlet conduit 49 for sputter target 13 and to inlet water line 97 for central anode assembly 10.

After evacuation, the chamber on which the magnetron sputter coating source has been installed is backfilled to a subatmospheric pressure of a sputter gas, which is usually argon. When sputter gas pressure and magnetic field intensities above sputter target 13 are within their appropriate ranges, operation of the magnetron sputter coating source can be initiated with the application of a required voltage from the glow discharge power supply, and coating of a substrate with material from sputter target 13 can commence.

Operation of the magnetron sputter coating source of FIG. 2 is essentially the same as for the source of FIG. 1. Unlike the source of FIG. 1, the source of FIG. 2 has no central anode. Anode 111 is connected to the positive terminal of the glow discharge power supply. The magnetic circuit comprises base plate 123, cylinders 122 and 124, top plate 127, which form a magnetic yoke, and polepieces 125 and 128, plus sputter target 113. Nonmagnetic ring 129 forms a vacuum seal to polepieces 125 and 128. The magnetic circuit parts are electrically joined together, and are insulated from anode 111. Because of its position relative to anode 111 and to polepieces 125 and 128, sputter target 113 serves as the cathode of the sputter source. During operation, the magnetic circuit and the cathode are connected to the negative voltage terminal of the glow discharge power supply. Electromagnet coil 120 is energized through electrical connectors 121 by a variable-voltage magnet power supply. Magnetic field intensities above the sputter surface of sputter target 113 depend both on the current in electromagnet coil 120 and on the magnetic permeability and saturation magnetization characteristics of the material of which sputter target 113 is made.

The current required to sensitize Hall probe 156 is provided by a Hall probe control unit, and the Hall voltage generated by Hall probe 156 is measured by the Hall probe control unit. Water for cooling sputter target 113 is injected into chamber 153 by a plurality of squirt tubes 154 directed toward the bottom of nonmagnetic ring 129.

After evacuation, the chamber on which the magnetron sputter coating source has been installed is backfilled to a subatmospheric pressure of a sputter gas, which is usually argon. When sputter gas pressure and magnetic field intensities above sputter target 113 are within their appropriate ranges, operation of the magnetron sputter coating source can be initiated with the application of a required voltage from the glow discharge power supply, and coating of a substrate with material from sputter target 113 can commence.

As an example, a sputter target 113 shown in FIG. 3 (inner radius equals 1.75 inches, outer radius equals 3.56 inches, vertical height equals 0.375 inches), and made of Permalloy, requires a current in electromagnet coil 120 of approximately 6 amperes (at less than 5 volts for an electromagnet power of less than 30 watts) to produce magnetic field intensities above the uneroded surface 203 of sputter target 113 sufficient to allow normal magnetic enhancement of the glow discharge. Representative magnetic field lines 201 above uneroded surface 203 are shown qualitatively in FIG. 3. The corresponding "magnetic tunnel" serves to confine the glow discharge. The resulting magnetically enhanced glow discharge operates at 600 volts and 1.7 amperes (for a glow discharge power of 1.0 kilowatts) at an argon sputter gas pressure of $4 \times 10^{-3}$ Torr, resulting in a substrate coating rate of approximately 1400 Angstroms per minute at a sputter target-to-substrate distance of 2.5 inches.

As operation of the magnetron sputter coating source continues, the sputter surface of target 113 is eroded away. In one experiment using a target 113 made of 410 stainless steel and operated at a fixed current of 7 amperes to electromagnet coil 120, eroded surface profile 204 was obtained after 52.6 kilowatt-hours of operation. As the erosion proceeded, the magnetic field intensities above the sputter surface increased, leading to a more tightly confined and lower voltage glow discharge. By the time profile 204 was obtained, the magnetic field intensities immediately above profile 204 had become large enough to render the glow discharge unstable. Because of this unstable operation, end of useful life at the coil current of 7 amperes had been reached for this target.

In a second experiment, a sputter target 113 made of Permalloy was operated with the current to electromagnet coil 120 being continually reduced to maintain a constant output Hall voltage from Hall probe 156. In this way, the magnetic field intensity at the position of Hall probe 156 was held constant as the sputter surface of target 113 was eroded away. Correspondingly, the magnetic field intensities above the sputter surface of target 113 changed comparatively little with target erosion, leading to a more nearly constant glow discharge impedance and to stable operation. Eroded surface profile 205 was obtained after 57.5 kilowatt-hours of operation.

As erosion of sputter target 113 proceeded toward profile 205, operation was interrupted periodically and the Hall voltage from the Hall probe 156 was measured with the current to electromagnet coil 120 returned to a reference value of 4 amperes. The results of these measurements are shown in curve 210 of FIG. 4. It may be seen from curve 210 that the magnetic field sensed by Hall probe 156 rose by over 50% during the first 40 kilowatt-hours of operation.

A comparison of profiles 204 and 205 reveals that operation at constant electromagnet coil current (profile 204) caused the erosion profile to be deeper and more sharply concentrated than operation at constant Hall voltage (profile 205). From this it is clear that the inventory of usable target material before end of useful life is reached is significantly greater under profile 205 operating conditions than under those for profile 204.

Another comparison of profiles 204 and 205 shows that the radius of maximum erosion is smaller for profile 204 than for profile 205. This is presumably due to the increase during operation in magnetic field intensities above the sputter surface of target 113. Associated with a change in the radius of maximum erosion is a change in the distribution pattern of sputtered material arriving at the substrate. In addition, the difference in the radii of maximum erosion for profiles 204 and 205 shows that magnetic field intensity changes (brought about by changes in the current to electromagnet coil 120) can be utilized to provide a measure of control over the radius of maximum erosion, and hence corresponding control over the distribution pattern.

An end-of-useful-life profile 207 has been estimated for sputter target 113. It has been further estimated that more than 100 kilowatt-hours of operation are required to reach profile 207. The significance of this is that the inventory of usable magnetic material contained in sputter target 113 is large enough to be of practical use in coating equipment for magnetic disk manufacture. The amount of usable magnetic material is, in fact, comparable with the amount of usable nonmagnetic material contained in the targets of many prior-art magnetron sputter coating sources.

One of the keys to success of the present invention is the use of an electromagnet rather than a permanent magnet. In prior-art magnetron sputter coating sources using permanent magnets and nonmagnetic sputter targets, target erosion usually leads to operation in magnetic fields of progressively greater intensities, with resulting changes in discharge impedance. It has been feasible to accommodate these changes through power supply design. With magnetic sputter targets, as the above-described experiment leading to profile 204 shows, the magnetic field intensities adjacent the target change much more rapidly with target erosion. As stated earlier, by the time eroded profile 204 was reached after 52.6 kilowatt-hours of operation, the glow discharge had become unstable. In effect, then, the end of useful life had been reached. Only by reducing the magnetomotive force, which in this case could be readily accomplished by reducing the current to electromagnet coil 120, could stable operation be achieved.

It is evident to one skilled in the art of magnetron sputter coating source design that sputter targets 13 and 113 made of nonmagnetic materials could be used effectively and efficiently in the magnetron sputter coating sources shown in FIGS. 1 and 2. It is possible that optimum configurations of polepieces 25 and 27 of FIG. 1 and polepieces 125 and 128 and FIG. 2 would be somewhat different for use with nonmagnetic materials than for use with strongly ferromagnetic materials. Inner polepieces 27 in FIG. 1 is shown as separate from cylinder 22 to facilitate replacing it with one of a different configuration, should that become necessary or desirable. In FIG. 2, top plate 127 with integral polepiece 128 is shown as readily removable, as is outer polepiece 125. The magnetron sputter coating sources of FIGS. 1 and 2 are thus well suited for use with sputter targets 13 and 113 having properties ranging from nonmagnetic to strongly ferromagnetic.

It has been mentioned previously that sputter target erosion leads to increasing magnetic field intensities above the sputter target surface, which leads in turn to a lower electrical impedance of the glow discharge, which reduces the voltage that can be sustained across the discharge at a given power level. Alternatively, operation at constant voltage leads to increased current, higher power, and higher sputtering rate, which may be undesirable. To maintain a fixed sputtering rate at a desired sputter gas pressure, it is necessary to operate at both higher current and higher power levels. The glow discharge power supply must therefore be capable of providing extended ranges of voltage, current, and power, which adversely affects both power supply and power consumption costs. The use of an electromagnet rather than a permanent magnet in the magnetron sputter coating sources of the present inventon makes for straightforward electrical control of the magnetic field intensities above the sputter target, thereby making it feasible to operate at constant values of glow discharge voltage, current, and power, for example, throughout sputter target life. This is so for both magnetic and nonmagnetic targets. Significant savings in both glow discharge power supply and power consumption costs should therefore be achievable.

The magnetic circuit designs employed in the disclosed embodiments of the present invention lead to very low reluctance magnetic paths and low magmetic losses. As a result, the electromagnet power required is low and control of the current to electromagnet coil 20 or 120 is relatively straightforward. It may well be that the cost savings achieved in glow discharge power supplies as a result of constant voltage operation will more than offset the cost of the magnet power supplies.

As mentioned previously, it is sometimes desirable to operate a glow discharge at a sputter gas pressure below the minimum pressure at which the discharge will ignite spontaneously with the normal application of voltage from the glow discharge power supply. One approach to this problem is to raise the sputter gas pressure sufficiently to allow ignition to occur, and then reduce sputter gas pressure to the desired operating level. Disadvantages of this approach include costs, complexity, and relatively long time constants (a significant fraction of the sputter coating times), as discussed earlier. With electrical control readily available of the magnetic field intensities adjacent the sputter surface of the targets 13 and 113, glow discharge ignition can be facilitated with a brief increase in current to the electromagnet coils 20 and 120.

In magnetron sputter coating sources generally, the cooling of sputter targets has posed one of the more challenging and pervasive problems. The approach to target cooling described in, for example, the aforementioned U.S. Pat. No. 4,100,055 employs a cooling jacket surrounding the outer circumference of the target. As discussed earlier, this approach to cooling sputter targets having relatively low thermal conductivities, as do many of the magnetic materials, may prove inadequate.

In the embodiment shown in FIG. 2, sputter target 113 is held in contact with polepieces 125 and 128 and with nonmagnetic ring 129 by clamps 141 and 142. As shown, a plurality of squirt tubes 154 directs jets of cooling water onto outer polepieces 125 and ring 129. The main impedance to heat transfer from sputter target 113 occurs at the interface between the bottom surface of sputter target 113 and the top surfaces of polepieces 125 and 128 and ring 129. Cooling of sputter target 113 may thus be aptly termed "indirect". This indirect cooling configuration is adequate for most magnetic sputter targets 113 of the dimension shown in FIG. 3 up to glow discharge power levels of perhaps 1 to 2 kilowatts, but may become inadequate at higher powers. Target warping, cracking, and even local melting may occur as a result of inadequate cooling.

The cooling means disclosed in FIG. 1 for sputter target 13 replaces the indirect cooling (as for sputter target 113) by a "direct" cooling in which the cooling water (or other coolant) is in direct physical contact with the bottom surface of sputter target 13, with no intervening thermal impedance imposed by the equivalent of nonmagnetic ring 129 of FIG. 2. A plurality of squirt tubes similar to squirt tubes 154 of FIG. 2 could be used to direct jets of cooling water onto the bottom surface of sputter target 13. Because cooling would be direct rather than indirect, operation at substantially increased glow discharge power levels would be feasible. The cooling means shown in FIG. 1 employs cylindrical septum 60 atop manifold 45 to divide the water cooling chamber into inlet annulus 61 and outlet annulus 62. Spacing 64 between the top of septum 60 and the bottom surface of sputter target 13 is chosen to force a radial flow of water which is essentially uniform along the circumference of septum 60 from inlet annulus 61 to outlet annulus 62. In this way, the circumferential variations in cooling that could result from a set of separated squirt tubes is avoided. In addition, simplification of the water distribution system is achieved. By choosing spacing 64 and water flow rates appropriately, turbulent flow over the bottom surface of sputter target 13 can be assured, thereby avoiding the formation of the stagnant fluid layers which inhibit heat transfer.

The above-described direct cooling system emplying septum 60 with spacing 64 thus provides a novel approach to the problem of sputter target cooling in magnetron sputter coating sources.

Direct cooling of sputter target 13 places a particular premium on avoiding warping, cracking, or melting of sputter target 13 which, if it occurred, would let the vacuum system "up to water"; this is a catastrophe to be assiduously avoided. The uniform circumferential cooling provided with the aid of septum 60 and spacing 64 greatly alleviates the problems of leaks due to warping, cracking, or melting. As the end of useful life is approached, the danger of a leak developing in sputter target 13 increases. One approach to determining when end of useful life is imminent is to simply keep track of the amount of sputter target life already used, measured, for example, in kilowatt-hours, and to stop operation when an empirically-established end-of-useful-life point has been reached. The absence or loss of such data makes it desirable to have alternative methods of determining when the end of useful life is near at hand. A second approach is to correlate the erosion status of sputter target 13 with the current to electromagnet coil 20 required to maintain a constant glow discharge operating voltage at a fixed sputter gas pressure and a fixed discharge power level. This coil current will decrease as target erosion proceeds, and the magnitude of the required coil currents will be higher for magnetic targets than for nonmagnetic ones. A third approach is to monitor the change in Hall voltage from Hall probe 67, at a fixed reference value of current to electromagnet coil 20, for example (as in FIG. 4), and to correlate this Hall voltage with the erosion of sputter target 13. Although this third approach is not usable with nonmagnetic sputter targets, (the Hall voltage should be independent of nonmagnetic sputter target erosion), it provides a particularly sensitive measure of sputter target erosion when used with strongly ferromagnetic sputter targets.

It will be seen from the foregoing that the present invention provides a novel magnetron sputter coating source capable of dispensing relatively large inventories of sputter target materials having magnetic properties ranging from nonmagnetic to highly ferromagnetic, with additional useful features relating to glow discharge power supplies, discharge ignition, target cooling, and target life monitoring. Although many modifications of the disclosed embodiments will occur to those skilled in the art, it is understood that this invention is to be limited only by the scope of the appended claims.

What is claimed is:

1. A magnetron sputter coating source comprising an anode, a cathode means including means for mounting a magnetic sputter target, and a magnetic field means including an electromagnet coil, a yoke, and a pair of polepieces separated by a spatial gap and joined to said yoke, said yoke and polepieces being made of materials of high magnetic permeability and high saturation magnetization, said magnetic sputter target being mounted so as to be positioned atop said polepieces, said gap and magnetic sputter target being configured and positioned so the target completely bridges said spatial gap, whereby a continuous magnetic path between said polepieces is provided through said target, an electric current flowing in said electromagnet coil causing magnetic field lines to be established in said yoke, polepieces, and magnetic sputter target, said coil current having a critical value, substantially all of said magnetic field lines being confined to the interior of said yoke, polepieces, and magnetic sputter target when said coil current is less than said critical value, a magnetically saturated portion of said magnetic sputter target occurring when said coil current is greater than said critical value, whereby a magnetic gap is established in said magnetic sputter target, said magnetic gap allowing fringing magnetic field lines to be established above and below said magnetic sputter target in the vicinity of said magnetic gap, said coil current having a required value, said required value being sufficiently greater than said critical value that said fringing magnetic field lines above said magnetic sputter target having required intensities may be established, thereby allowing a magnetically confined and magnetically enhanced glow discharge to be established above said magnetic sputter target in a region adjacent said magnetic gap.

2. A magnetron sputter coating source as in claim 1 wherein said yoke and polepieces are configured to form a low reluctance magnetic path through said yoke and polepieces, said yoke and polepieces being configured so they are magnetically unsaturated for all said required values of said coil current.

3. A magnetron sputter coating source as in claim 1 wherein magnetically unsaturated portions adjacent said magnetically saturated portions of said magnetic sputter target serve as extensions of said polepieces.

4. A magnetron sputter coating source as in claim 1 wherein a relatively thick configuration of said magnetic sputter target is employed to allow a desirably large inventory of usable material to be contained in said magnetic sputter target.

5. A magnetron sputter coating source as in claim 1 wherein during operation said magnetic sputter target is maintained at a temperature below the Curie temperature of the material of said magnetic sputter target.

6. A magnetron sputter coating source as in claim 1 wherein said required value of said coil current is adjusted to provide desirable schedules of operating voltage and current to said glow discharge at desired sputter gas pressures throughout the useful life of said magnetic sputter target.

7. A magnetron sputter coating source as in claim 1 wherein said required value of said coil current is adjusted to provide constant desired values of operating voltage and current to said glow discharge at a desired sputter gas pressure throughout the useful life of said magnetic sputter target.

8. A magnetron sputter coating source as in claim 1 including also a Hall probe for measuring a magnetic field intensity at a position of said Hall probe, said Hall probe being positioned below and closely adjacent said magnetic sputter target near the region of maximum target erosion produced by said glow discharge, an output Hall probe voltage from said Hall probe being proportional to the magnetic field intensity at the position of said Hall probe.

9. A magnetron sputter coating source as in claim 8 wherein said required value of said coil current is adjusted to provide a constant desired value of said Hall probe voltage throughout the useful life of said magnetic sputter target.

10. A magnetron sputter coating source as in claim 8 wherein said required value of said coil current is adjusted to provide desired schedules of operating voltage and current to said glow discharge at desired sputter gas pressures throughout the useful life of said magnetic sputter target, with said coil current being returned periodically to a selected reference value to permit said Hall probe voltage to be coincidentally measured at said selected reference value, whereby a curve may be generated of said Hall probe voltage vs. accumulated operation of said magnetic sputter target, said curve being extended to the end of useful lives of initial samples of said magnetic sputter target, said curve being useful in assessing the approach to the end of useful life of subsequent samples of said magnetic sputter target.

11. A magnetron sputter coating source as in claim 1 wherein said polepieces are readily removable from said yoke and are replaceable thereon by polepieces of differing configurations, thereby allowing a change in the configurations of said polepieces to be employed to produce a change in the location of said spatial gap with said yoke and electromagnet coil remaining unchanged, said change in said spatial gap location giving rise to corresponding changes in locations of said magnetic gap and said glow discharge, thereby effecting a corresponding change in the distribution pattern of sputtered material from said magnetic sputter target.

12. A magnetron sputter coating source as in claim 1 wherein a change in said required value of said coil current is employed to produce changes in the width and location of said magnetic gap, said changes in said magnetic gap giving rise to a corresponding change in the location of said glow discharge, thereby effecting a corresponding change in the distribution pattern of sputtered material from said magnetic sputter target.

13. A magnetron sputter coating source comprising an anode, a cathode means including a sputter target, and a magnetic field means including an electromagnetic net coil, a yoke, and a pair of polepieces separated by a spatial gap and joined to said yoke, said yoke and polepieces being made of materials of high magnetic permeability and high saturation magnetization, said sputter target being positioned atop said polepieces and bridging said spatial gap, said spatial gap allowing magnetic field lines to be established for magnetically confining and magnetically enhancing a glow discharge above said sputter target, shapes and intensities of said magnetic field lines depending on an electric current flowing in said electromagnet coil and also depending on a material of which said sputter target is made, said coil current having a required first value for desired glow discharge establishment when said sputter target material is nonmagnetic, said coil current having a required second value for desired glow discharge establishment when said sputter target material is magnetic, said required second value being greater than said required first value to provide magnetic saturation of a portion of said magnetic sputter target, thereby creating a magnetic gap in said magnetic sputter target across which glow discharge confining and enhancing magnetic fields above said magnetic sputter target can be established.

14. A magnetron sputter coating source as in claim 13 wherein said yoke and polepieces are configured to form a low reluctance magnetic path through said yoke and polepieces, said yoke and polepieces being magnetically unsaturated for all said required values of said coil current.

15. A magnetron sputter coating source as in claim 13 wherein said sputter target has a configuration which is independent of the magnetic permeability and saturation magnetization characteristics of the material of said sputter target.

16. A magnetron sputter coating source as in claim 13 wherein a relative thick configuration of said sputter target is employed to allow a desirably large inventory of usable material to be contained in said sputter target, independent of magnetic permeability and saturation magnetization characteristics of the material of said sputter target.

17. A magnetron sputter coating source as in claim 13 wherein said polepieces are readily removable from said yoke and are replaceable thereon by polepieces of differing configurations, whereby said sputter targets made of materials having a wide range of magnetic characteristics, including nonmagnetic, may be optimally employed.

18. A magnetron sputter coating source as in claim 13 wherein said first required value of said coil current is adjusted to provide desired schedules of operating voltage and current to said glow discharge at desired sputter gas pressures throughout the useful life of said nonmagnetic sputter target.

19. A magnetron sputter coating source as in claim 13 wherein said second required value of said coil current is adjusted to provide desired schedules of operating voltage and current to said glow discharge at desired sputter gas pressures throughout the useful life of said magnetic sputter target.

20. A magnetron sputter coating source as in claim 13 wherein said first required value of said coil current is adjusted to provide constant desired values of operating voltage and current to said glow discharge at a desired sputter gas pressure throughout the useful life of said nonmagnetic sputter target.

21. A magnetron sputter coating source as in claim 13 wherein said second required value of said coil current is adjusted to provide constant desired values of operating voltage and current to said glow discharge at a desired sputter gas pressure throughout the useful life of said magnetic sputter target.

22. A magnetron sputter coating source as in claim 13 including also a Hall probe for measuring a magnetic field intensity at a position of said Hall probe, said Hall probe being positioned below and closely adjacent said sputter target near the region of maximum target erosion produced by said glow discharge, a Hall output voltage from said Hall probe being proportional to the magnetic field intensity at the position of said Hall probe.

23. A magnetron sputter coating source as in claim 22 wherein said second required value of said coil current is adjusted to provide a constant desired value of said Hall probe voltage throughout the useful life of said magnetic sputter target.

24. A magnetron sputter coating source as in claim 22 wherein said second required value of said coil current is adjusted to provide desired schedules of operating voltage and current to said glow discharge at desired sputter gas pressures throughout the useful life of said magnetic sputter target, with said coil current being returned periodically to a selected reference value to permit said Hall probe voltage to be coincidentally measured at said selected reference value, whereby a curve may be generated of said Hall probe voltage vs. accumulated operation of said magnetic sputter target, said curve being extended to the end of useful lives of initial samples of said magnetic sputter target, said curve being useful in assessing the approach to end of useful life of subsequent samples of said magnetic sputter target.

25. A magnetron sputter coating source as in claim 20 wherein the changes in said first required value of said coil current with accumulated operation are used to assess the approach to the end of useful life of said nonmagnetic sputter target.

26. A magnetron sputter coating source as in claim 22 wherein said first required value of said coil current is adjusted to provide constant desired values of operating voltage and current to said glow discharge at a desired sputter gas pressure throughout the useful life of said nonmagnetic sputter target, and wherein further the changes in said Hall probe voltage with accumulated operation are used to assess the approach to the end of useful life of said nonmagnetic sputter target.

27. A magnetron sputter coating source as in claim 13 wherein said polepieces are readily removable from said yoke and are replaceable thereon by polepieces of differing configurations, thereby allowing a change in the configurations of said polepieces to be employed to produce a change in the location of said spatial gap with said yoke and electromagnet coil remaining unchanged, said change in said spatial gap location giving rise to a corresponding change in the location of said glow discharge, thereby effecting a corresponding change in the distribution pattern of sputtered material from said sputter target.

28. A magnetron sputter coating source as in claim 13 wherein said coil current is momentarily increased above its said required value, thereby momentarily increasing the magnetic field intensities above said sputter target, whereby operation of said glow discharge may be initiated at a desired sputter gas operating pressure which is below the sputter gas pressure at which a glow discharge can normally be readily ignited.

29. A magnetron sputter coating source as in claim 13 wherein a conversion of said magnetron sputter coating source to an essentially nonmagnetic diode apparatus is accomplished by reducing said coil current to zero.

30. A magnetron sputter coating source as in claim 29 wherein a more complete conversion of said magnetron sputter coating source to a nonmagnetic diode apparatus is accomplished by applying a suitable value of reverse current to said electromagnet coil, followed by reduction of said reverse coil current to zero, whereby essentially complete demagnetization of said yoke, polepieces, and magnetic sputter target is accomplished.

31. A magnetron sputter coating source comprising an anode, a cathode means including means for mounting a sputter target, a means for cooling said sputter target, and a magnetic field means including a yoke and a pair of polepieces separated by a gap and joined to said yoke, said polepiece gap being configured to form a closed peripheral path lying generally in a horizontal plane, said yoke and polepieces being made of magnetic materials, said sputter target being positioned atop said polepieces and bridging said polepiece gap, a vacuum seal being provided between a bottom surface of said sputter target and top surfaces of said polepieces, said polepiece gap allowing magnetic field lines to be established for magnetically confining and magnetically enhancing a glow discharge above said sputter target, a top surface of said sputter target being subject to intense bombardment by positive ions produced in said glow discharge, said intense ion bombardment causing intense heating of said sputter target, said intense ion bombardment being concentrated in a region generally above said polepiece gap, forming thereby a peripheral path of intense heating of said sputter target, said cooling means including a water chamber, a portion of said sputter target bottom surface between said polepiece gap being part of the interior surface of said water chamber, said water chamber being divided into inlet and outlet portions by a septum, said septum being positioned below said sputter target bottom surface and directly beneath said region of intense ion bombardment, said septum being configured to form a closed peripheral path corresponding to said polepiece gap peripheral path, a narrow gap being provided between a top surface of said septum and said sputter target bottom surface, said narrow gap providing a high impedance to water flow, said narrow gap causing cooling water flowing from said inlet portion to said outlet portion of said water chamber to make intimate thermal contact with said sputter target bottom surface, said intimate thermal contact being substantially uniform over said polepiece gap peripheral path, whereby substantially uniform cooling of said sputter target is achieved along said peripheral path of intense heating of said sputter target.

32. A magnetron sputter coating source as in claim 32 including also a Hall probe for measuring a magnetic field intensity at a position of said Hall probe, said Hall probe being positioned in a small portion of said peripheral path of said septum, a close fit being established between side walls of said Hall probe and adjacent ends of said septum, said close fit preventing a significant perturbation in the flow of cooling water through said narrow gap between said septum top surface and said sputter target bottom surface, a second narrow gap being established between a top surface of said Hall probe and said sputter target bottom surface, said second narrow gap being chosen to provide a high impedance to water flow which is substantially the same as said high impedance provided by said narrow gap between said septum top surface and said sputter target bottom surface, whereby despite inclusion of said Hall probe the effectiveness of said cooling means is preserved.

33. A magnetically enhanced sputter coating source comprising anode means, cathode means, magnetic means for forming a magnetic field in the proximity of said cathode means, means for measuring magnetic field strengths, said measuring means being mounted in a position to provide a measurement of said magnetic field during operation of said source.

34. A magnetically enhanced sputter coating source as claimed in claim 33 wherein said magnetic means comprises spaced-apart polepieces of opposite magnetic polarity to form a magnetic field therebetween, and said measuring means being positioned in the magnetic field between said polepieces.

35. A magnetically enchanced sputter coating source as claimed in claim 34 wherein said cathode is adapted for attachment thereto of a sputter target having a sputter surface and an opposite surface, and said measuring means is so positioned as to be adjacent said opposite surface when a sputter target is attached to said cathode means.

36. A magnetically enhanced sputter coating source comprising anode means, cathode means, magnetic field means comprising a central polepiece forming the center axis of said source, an electromagnet coil coaxially surrounding said central polepiece, and an annular polepiece coaxially surrounding said coil, said polepieces being configured to form coplanar end surfaces having annular pole faces spaced apart to form a planar annular nonmagnetic gap.

37. A magnetically enhanced sputter coating source as claimed in claim 36 wherein nonmagnetic material is sealed to said pole faces to close the space between said pole faces.

38. A magnetically enchanced sputter coating source comprising magnetic means including inner and outer annular ferromagnetic members spaced apart radially, said annular ferromagnetic members forming polepieces separated by an annular space, electromagnet coil means positioned in the space between said annular members, anode means supported in the space within said inner annular member, and said polepieces being electrically insulated from said anode means to form cathode means.

39. A magnetically enhanced sputter coating source as claimed in claim 38 comprising means for supporting an annular sputter target across one end of said annular members.

40. A method of operating a magnetron sputter coating source having an anode, a cathode means including a magnetic sputter target, and a magnetic field means including an electromagnet coil, a yoke, and a pair of polepieces separated by a spatial gap and joined to said yoke, said yoke and polepieces being made of materials of high magnetic permeability and high saturation magnetization, the method comprising positioning said magnetic sputter target atop said polepieces so the target completely bridges said spatial gap, whereby a continuous magnetic path between said polepieces is provided through said target, applying an electric current to said electromagnet coil so magnetic field lines are established in said yoke, polepieces, and magnetic sputter target, said coil current having a critical value, substantially all of said magnetic field lines being confined to the interior of said yoke, polepieces, and magnetic sputter target when said coil current is less than said critical value, and establishing a magnetic gap in said magnetic sputter target by adjusting said coil current to be greater than said critical value so a magnetically saturated portion of said magnetic sputter target occurs, fringing magnetic field lines thereby being established above and below said magnetic sputter target in the vicinity of said magnetic gap.

41. The method of claim 40 wherein said coil current has a required value, said required value being sufficiently greater than said critical value that said fringing magnetic field lines above said magnetic sputter target having required intensities may be established, and adjusting the coil current to the required value so a magnetically confined and magnetically enhanced glow discharge is established above said magnetic sputter target in a region adjacent said magnetic gap.

42. The method of claim 40 wherein said yoke and polepieces are configured to form a low reluctance magnetic path through said yoke and polepieces, and adjusting said coil current so said yoke and polepieces are magnetically unsaturated.

43. The method of claim 40 further comprising the step of maintaining the material of said magnetic sputter target at a temperature below the Curie temperature thereof during operation of the sputter coating source.

44. The method of claim 40 further including adjusting the required value of said coil current to provide a desirable schedule of operating voltage and current to said glow discharge at desired sputter gas pressures throughout the useful life of said magnetic sputter target.

45. The method of claim 40 further including adjusting the required value of said coil current to provide a constant desired value of operating voltage and current to said glow discharge at a desired sputter gas pressure throughout the useful life of said magnetic sputter target.

46. The method of claim 40 wherein the magnetron sputter coating source includes a detector for measuring a magnetic field intensity at a position near a region of maximum target erosion produced by said glow discharge, the detector deriving a signal having a value representing the magnetic field intensity at said region and adjusting said required value of said coil current to provide a constant desired value for said detector signal value throughout the useful life of said magnetic sputter target.

47. The method of claim 40 wherein the magnetron sputter coating source includes a detector for measuring a magnetic field intensity at a position near a region of maximum target erosion produced by said glow discharge, the detector deriving a signal having a value representing the magnetic field intensity at said region, adjusting the required value of said coil current to provide desired schedule of operating voltage and current to said glow discharge at desired sputter gas pressures throughout the useful life of said magnetic sputter target, from time to time returning said coil current to a selected reference value, and measuring the value of the signal derived by the detector while the coil current is returned to said selected reference value.

48. The method of claim 47 further including the step of responding to the measured signal values to generate a curve of said magnetic field intensity vs. accumulated operation of said magnetic sputter target, said curve being extended to the end of useful lives of initial samples of said magnetic sputter target, said curve being useful in assessing the approach to the end of useful life of subsequent samples of said magnetic sputter target.

49. The method of claim 40 comprising changing the configurations of said polepieces to change the location of said spatial gap with said yoke by removing said polepieces from said yoke and replacing them thereon by polepieces of differing configurations without changing the electromagnet coil, said change in said spatial gap location giving rise to corresponding changes in locations of said magnetic gap and said glow discharge, thereby effecting a corresponding change in the distribution pattern of sputtered material from said magnetic sputter target.

50. The method of claim 40 comprising changing the required value of said coil current to change the width and location of said magnetic gap, said changes in said magnetic gap giving rise to a corresponding change in the location of said glow discharge, thereby effecting a corresponding change in the distribution pattern of sputtered material from said magnetic sputter target.

51. A method of operating a magnetron sputter coating source including: an anode, a cathode means including a sputter target, and a magnetic field means including an electromagnetic coil, a yoke, and a pair of polepieces separated by a spatial gap and joined to said yoke, said yoke and polepieces being made of materials of high magnetic permeability and high saturation magnetization, said sputter target being positioned atop said polepieces and bridging said spatial gap, said spatial gap allowing magnetic field lines to be established for magnetically confining and magnetically enhancing a glow discharge above said sputter target, said magnetic field lines having shapes and intensities depending on an electric current flowing in said electromagnet coil and on a material of which said sputter target is made; the method comprising inserting a non-magnetic target, and adjusting said coil current to a required first value for establishing a desired glow discharge while the non-magnetic target is inserted; inserting a magnetic target, adjusting said coil current to a required second value for desired glow discharge establishment while the magnetic target is inserted, said required second value being greater than said required first value to provide magnetic saturation of a portion of said magnetic sputter target and having a value sufficient to form a magnetic gap in said magnetic sputter target across which glow discharge confining and enhancing magnetic fields above said magnetic sputter target are established.

52. The method of claim 51 wherein said yoke and polepieces are configured to form a low reluctance magnetic path through said yoke and polepieces, and setting the required values of said coil current to said yoke and polepieces are magnetically unsaturated.

53. The method of claim 52 comprising adjusting the first required value of said coil current to provide desired schedules of operating voltage and current to said glow discharge at desired sputter gas pressures throughout the useful life of said nonmagnetic sputter target.

54. The method of claim 52 comprising adjusting the second required value of said coil current to provide desired schedules of operating voltage and current to said glow discharge at desired sputter gas pressures throughout the useful life of said magnetic sputter target.

55. The method of claim 52 comprising adjusting said first required value of said coil current to provide constant desired values of operating voltage and current to said glow discharge at a desired sputter gas pressure throughout the useful life of said nonmagnetic sputter target.

56. The method of claim 52 comprising adjusting the second required value of said coil current to provide constant desired values of operating voltage and current to said glow discharge at a desired sputter gas pressure throughout the useful life of said magnetic sputter target.

57. The method of claim 52 wherein the magnetron sputter coating source includes a detector for measuring a magnetic field intensity at a position near a region of maximum target erosion produced by said glow discharge, the detector deriving a signal having a value representing the magnetic field intensity at said region, adjusting the second required value of said coil current to provide a constant desired value of said measured magnetic field intensity throughout the useful life of said magnetic sputter target.

58. The method of claim 52 wherein the magnetron sputter coating source includes a detector for measuring a magnetic field intensity at a position near a region of maximum target erosion produced by said glow discharge, the detector deriving a signal having a value representing the magnetic field intensity at said region, adjusting the second required value of said coil current to provide desired schedules of operating voltage and current to said glow discharge at desired sputter gas pressures throughout the useful life of said magnetic sputter target, from time to time returning said coil current to a selected reference value, and measuring the value of the signal derived by the detector while the coil current is returned to said selected reference value.

59. The method of claim 58 further including the step of responding to the measured signal values to generate a curve of said magnetic field intensity vs. accumulated operation of said magnetic sputter target, said curve being extended to the end of useful lives of initial samples of said magnetic sputter target, said curve being useful in assessing the approach to the end of useful life of subsequent samples of said magnetic sputter target.

60. The method of claim 52 further including momentarily increasing said coil current above its said required value, thereby momentarily increasing the magnetic field intensities above said sputter target to initiate operation of said glow discharge at a desired sputter gas operating pressure which is below the sputter gas pressure at which a glow discharge can normally be readily ignited.

61. The method of claim 52 further including converting said magnetron sputter coating source to an essentially nonmagnetic diode apparatus by reducing said coil current to zero.

62. The method of claim 52 further including converting said magnetron sputter coating source to a nonmagnetic diode apparatus by demagnetizing said yoke, polepieces, and magnetic sputter target after the source has been operated as a magnetic apparatus and prior to operating it as a diode apparatus.

63. The method of claim 62 wherein the demagnetization is performed by reversing the polarity of DC current applied to said electromagnet coil and then reducing said reverse coil current to zero.

64. A magnetron sputter coating source comprising an anode, cathode means including means for mounting a sputter target, means for cooling said sputter target, and a magnetic field means including a yoke and a pair of polepieces separated by a gap and joined to said yoke, said polepiece gap being configured to form a closed peripheral path lying generally in a horizontal plane, said yoke and polepieces being made of magnetic materials, said sputter target being positioned atop said polepieces, a vacuum seal being provided between a bottom surface of said sputter target and top surfaces of said polepieces, a top surface of said sputter target being subject to intense bombardment by positive ions produced in a glow discharge established in the source, said intense ion bombardment causing intense heating of said sputter target, said intense ion bombardment being concentrated in a region generally above said polepiece gap thereby forming a peripheral path of intense heating of said sputter target, said cooling means including: a cooling fluid chamber, a portion of said sputter target bottom surface between said polepiece gap being part of an interior surface of said chamber, means positioned below said sputter target bottom surface for dividing said chamber into inlet and outlet portions, said dividing means being configured to form a closed peripheral path corresponding to said polepiece gap peripheral path.

65. The source of claim 64 further including means for providing a relatively high flow impedance between a top portion of said means for dividing said sputter target bottom surface, high flow impedance means causing cooling fluid flowing from said inlet portion to said outlet portion of said chamber to have intimate thermal contact with said sputter target bottom surface, said initimate thermal contact being substantially uniform over said polepiece gap peripheral path, whereby substantially uniform cooling of said sputter target is achieved along said peripheral path of intense heating of said sputter target.

66. The magnetron sputter coating source of claim 64 further including a magnetic field intensity detector, said detector being positioned in a small portion of said peripheral path of said means for dividing, a close fit being established between side walls of said detector and adjacent ends of said means for dividing, said close fit preventing a significant perturbation in the flow of cooling fluid through said narrow gap between said dividing means top surface and said sputter target bottom surface, a second narrow gap being established between a top surface of said detector and said sputter target bottom surface, said second narrow gap having a high flow impedance which is substantially the same as said high impedance provided by said narrow gap between said means for dividing and said sputter target bottom surface, whereby the effectiveness of said cooling means is preserved despite inclusion of said detector.

67. A method of operating a sputtering apparatus as a magnetron sputter coating source for a substrate or as a nonmagnetic diode sputtering device for a workpiece, the apparatus including a target cathode, an anode, means for forming a glow discharge, and an electromagnet, the method comprising applying a DC voltage between the anode and cathode while a current is applied to the electromagnet and the glow discharge is formed to cause the apparatus to operate as a magnetron sputter coating source so atoms are deposited on the substrate, and applying a DC voltage between the anode and cathode while no current is applied to the electromagnet and the glow discharge is formed to cause the apparatus to operate as a nonmagnetic diode sputtering device so atoms are incident on the work piece.

68. The method of claim 66 wherein the sputtering apparatus includes structures having a tendency to become permanently magnetized in response to a magnetic field derived from the electromagnet during operation of the apparatus as a magnetron source, and further comprising the step of removing the permanent magnetization from said structures prior to operating the sputtering apparatus as a nonmagnetic diode device.

69. The method of claim 68 wherein the permanent magnetization is removed from the structures by reversing the direction of DC current applied to the electromagnet while the apparatus is operated as a magnetron sputter coating source, and then reducing the magnitude of the reverse current applied to the electromagnet to zero prior to operating the sputtering apparatus as a nonmagnetic diode device.

70. A magnetically enhanced sputter coating source comprising anode means, cathode means, means for forming a magnetic field in proximity to said cathode means, magnetic field strength measuring means mounted in a position to provide a measurement of the formed magnetic field during operation of said coating source.

71. A method of controlling a sputter coating depositing apparatus including a magnetic target cathode, an anode and a plasma, ionizing electrons for the plasma having a tendency to be confined in proximity to an emitting surface of the target by a magnetic field having lines of flux adjacent the emitting surface, the confining magnetic field intersecting electric field lines extending between the anode and cathode, atoms from the emitting surface being deposited on a substrate, the method comprising applying a magnetic field to the target, the magnetic field having an intensity sufficient to saturate magnetic material of the target and establish a magnetic fringing field in proximity to the emitting surface, the magnetic fringing field being the confining magnetic field, and controlling the magnetic field in response to an indication of plasma impedance.

72. The method of claim 71 wherein the target has a tendency to change temperature during operation, and changing the amplitude of the magnetic field so that the fringing field configuration has a tendency to be constant on a short term basis.

73. A method of controlling a process for sputter coating substrates with an apparatus including a target cathode, an anode and means for establishing a glow discharge between the anode and cathode, the improvement comprising sensing a magnetic field in proximity to the target cathode to sense a fringing field of the target cathode and controlling a function of the plasma impedance in response to the sensed magnetic field.

* * * * *